United States Patent
Li et al.

(10) Patent No.: US 7,935,566 B2
(45) Date of Patent: May 3, 2011

(54) EMBOSSING PRINTING FOR FABRICATION OF ORGANIC FIELD EFFECT TRANSISTORS AND ITS INTEGRATED DEVICES

(75) Inventors: Chang Ming Li, Singapore (SG); Mary Bee Eng Chan, Singapore (SG); Jun Zhang, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 12/600,151

(22) PCT Filed: May 14, 2008

(86) PCT No.: PCT/SG2008/000185
§ 371 (c)(1),
(2), (4) Date: Nov. 13, 2009

(87) PCT Pub. No.: WO2008/140425
PCT Pub. Date: Nov. 20, 2008

(65) Prior Publication Data
US 2010/0136739 A1    Jun. 3, 2010

Related U.S. Application Data

(60) Provisional application No. 60/917,698, filed on May 14, 2007.

(51) Int. Cl.
*H01L 51/40*    (2006.01)
*H01L 21/00*    (2006.01)

(52) U.S. Cl. .................... 438/99; 438/82; 257/E51.003; 257/E51.005

(58) Field of Classification Search .................... 438/82, 438/99; 257/40, E51.003, E51.004, E51.005
See application file for complete search history.

(56) References Cited

U.S. PATENT DOCUMENTS

| 2004/0063267 | A1 | 4/2004 | Berndt |
| 2004/0262599 | A1 | 12/2004 | Berndt |
| 2005/0071969 | A1 | 4/2005 | Sirringhaus |
| 2006/0115998 | A1 | 6/2006 | Shin |
| 2010/0136739 | A1* | 6/2010 | Li et al. .................... 438/99 |

FOREIGN PATENT DOCUMENTS

| WO | 2004006291 A2 | 1/2004 |
| WO | 2004111729 A1 | 12/2004 |

OTHER PUBLICATIONS

Gunther Leising, et al., "Nanoimprinted devices for intergrated organic electronics", Microelectronic Engineering 83 (2006) 831-838.
International Search Report PCT/SG2008/000185 Dated Jul. 30, 2008.

* cited by examiner

*Primary Examiner* — Walter L Lindsay, Jr.
(74) *Attorney, Agent, or Firm* — Cantor Colburn LLP

(57) ABSTRACT

A method of fabricating an organic field effect transistor (OFET) includes forming at least one OFET structure by ultraviolet (UV) transfer embossing printing, where, in an example embodiment, the method includes providing ink material on at least part of a patterned surface of a mold, where the mold 100 is then contacted on a coating of ultraviolet (UV) curable resin on a substrate so as to insert at least part of the ink material into the resin, the resin is then irradiated with UV light, and the mold is separated from the resin so as to transfer the ink material onto the substrate to form at least one OFET structure.

18 Claims, 5 Drawing Sheets

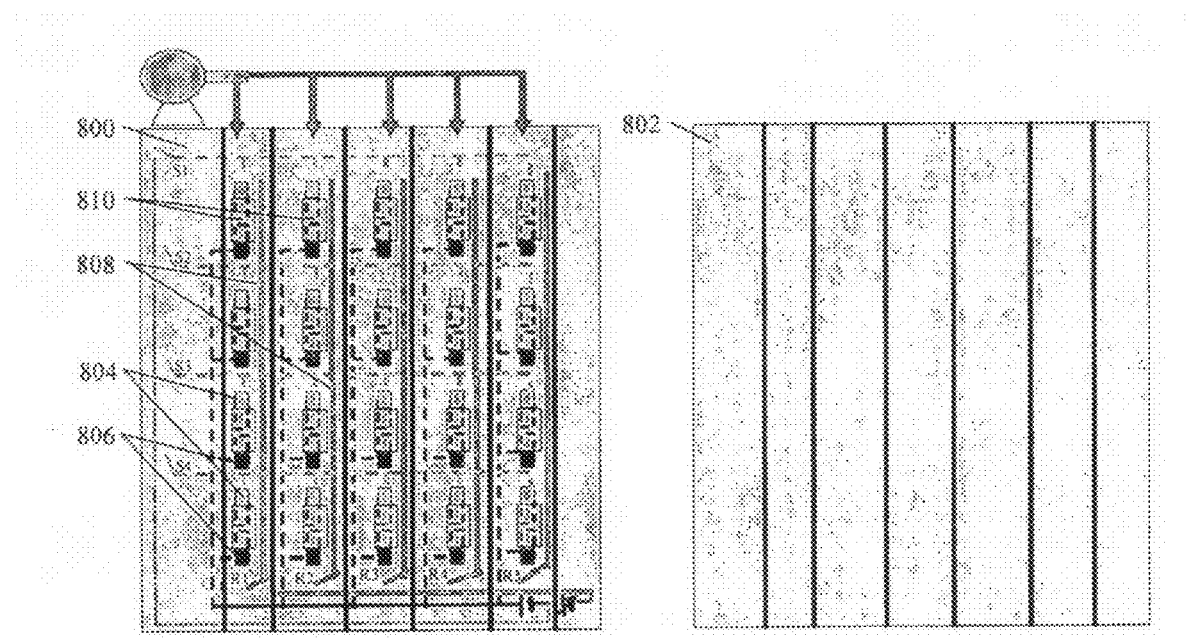
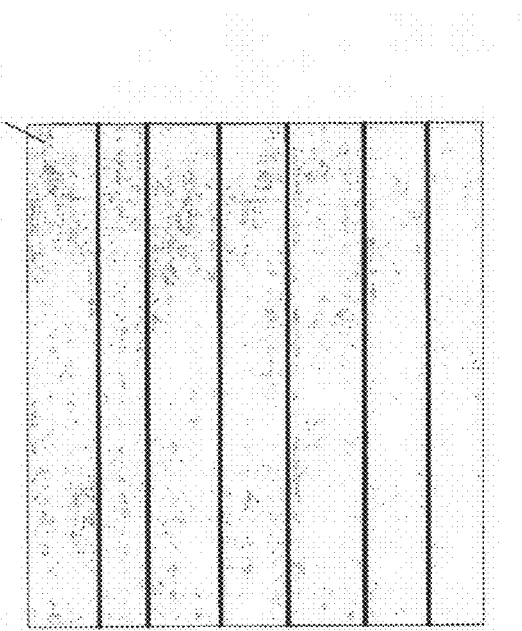
FIGURE 8A
FIGURE 8B
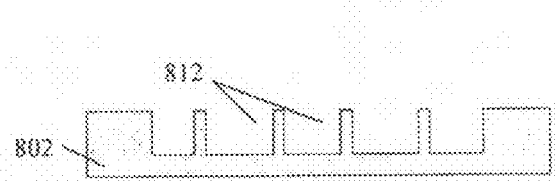
FIGURE 8C
FIGURE 8D
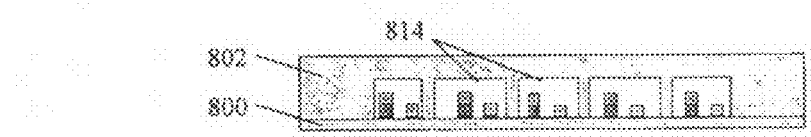
FIGURE 8E

EMBOSSING PRINTING FOR FABRICATION OF ORGANIC FIELD EFFECT TRANSISTORS AND ITS INTEGRATED DEVICES

TECHNICAL FIELD

The present invention relates to embossing printing for the fabrication of organic field effect transistors (OFETs) and its integrated devices. More specifically, though not exclusively, the present invention relates to the fabrication of micro-array patterns and integrated electronics for devices such as OFET-based biochips.

BACKGROUND

OFETs, or more generally organic/polymer molecular electronics and devices, have been envisioned as a viable alternative to more traditional, mainstream thin-film transistor (TFT) based on inorganic materials. The processing characteristics and demonstrated performance of OFETs suggest that they can be competitive for existing TFT applications. Miniaturisation of the OFET structure is important for OFET applications as it increases the device density and decreases its power consumption. It also provides the best scaling factors for improved OFET performance, non-limiting examples of which include increased drain current and reduced modulation voltages. Miniaturised OFETs may enable organic transistors to compete with high-end applications of inorganic transistors.

However, the practical implementation of OFETs in electronic applications will ultimately be decided by the ability to produce devices and circuits at a cost that is significantly below that needed to manufacture conventional electronic circuits based on, for example, silicon. Although the cost of the organic materials used in most thin-film devices is low, the materials cost rarely determines that of the end product in electronics, where fabrication and packaging costs typically dominate. Hence, the successful application of OFETs will depend on capturing its low-cost potential through the innovative fabrication of devices on inexpensive, large-area substrates. This suggests that conventional semiconductor device fabrication technologies need to be adapted to handle large-area, flexible substrates spanned by organic macroelectronic circuits, and to be compatible with the physical and chemical properties of the organic compounds used.

Several methods have been used to fabricate OFETs, including screen printing, photolithography, dip coating and jet printing. For high-throughput production, dip coating is not feasible for making large area coverage OFET-based devices. Screen-printing and soft lithography printing have been explored for the fabrication of OFETs, but the former technique is limited to relatively large features (>100 µm) and the layer-to-layer registration of the latter has not been demonstrated to be better than 50 µm. Jet printing is an alternative technique for all printed OFETs. However, the smallest features in reported works are about 25 µm. There is no report of mass manufacturing technology for low micron (less than 10 µm) and nano scale OFETs. As outlined earlier, miniaturisation of the structure of an OFET is critical for its applications.

SUMMARY

The present invention is defined in the independent claims. Some optional features of the present invention are defined in the dependent claims.

In general terms, in one aspect, the present invention relates to a method of fabricating at least one OFET structure by ultraviolet (UV) transfer embossing printing. The term 'OFET structure' as used herein denotes one or more of the following structural features of an OFET: source electrode, drain electrode, gate electrode, active layer and gate dielectric layer. The term 'UV transfer embossing printing' as used herein refers to a pattern transfer method using a patterned mold to imprint ink material into a UV-curable resin, which is subsequently hardened by UV irradiation. Put simply, UV transfer embossing printing involves the use of a mold as a printing template and UV-curable resin as an adhesive, rather than a structure material. In one example form, the method involves the use of a transparent substrate with a coating of liquid or semi-solid UV-curable resin mix, which is pressed against a patterned embossing mold. The resin mix is then irradiated with UV light before demolding to produce hardened structures. While the ultimate resolution capability of UV transfer embossing printing depends solely on the patterns on the mold (typically formed as a master stamp), the applicant has found that UV transfer embossing printing can rapidly pattern relatively large-area substrates with feature sizes below 100 µm. UV transfer embossing printing employing low viscosity resin, also known as liquid embossing, can be used for the formation of high (>5) or very high (>10) aspect ratio (width-to-height ratio) micron- and sub-micron features.

The use of UV transfer embossing printing allows the fabrication of a variety of materials, which form part of the OFET structure, onto a flexible substrate in a low temperature and low pressure environment. Also, UV transfer embossing printing allows micro-scale or nano-scale patterns to be provided over large area, thus allowing arrays of micro-scale or nano-scale OFETs to be fabricated at a time. This, in turn, allows the fabrication of OFETs in a web-to-web or roll-to-roll fashion, which increases the throughput and efficiency of OFET fabrication at a low cost.

In general terms, in another aspect, the present invention relates to an OFET, having at least one OFET structure that is provided on a substrate by UV transfer embossing printing. The resulting OFET includes at least one OFET structure formed on UV cured resin. Preferably, the OFET's source, drain and gate electrodes are formed on UV cured resins on a flexible substrate. Given the ability of UV transfer embossing printing, the source and drain electrodes of the OFET may be arranged such that they are separated by a micro-scale or nano-scale channel. Such an OFET may be used in the production of low cost and high density lab-on-chip arrays. Specifically, in one embodiment, a biochip having arrays of OFETs distributed in a plurality of microchannels may be efficiently formed with addressable sites that reduce the number of input/output lines for simpler multiplexing and thus reduced cost of the detection system.

BRIEF DESCRIPTION OF THE DRAWINGS

In order that the invention may be fully understood and readily put into practical effect, exemplary embodiments will now be described by way of non-limitative example only and with reference to the accompanying drawings.

In the drawings:

FIGS. 8A and 8B are plan view diagrams of a base part and a cover part of an example embodiment of an OFET-based lab-on-chip system;

FIGS. 8C and 8D are cross-section diagrams of the base part and the cover part of FIGS. 8A and 8B;

FIG. 8E is a cross-section diagram of the OFET-based lab-on-chip system of FIGS. 8A and 8B;

DETAILED DESCRIPTION OF EXEMPLARY EMBODIMENTS

One exemplary embodiment of the method of fabricating OFETs will now be described with reference to FIG. 1. An embossing mold 100, which may be made of metal, rigid plastic or the like, is provided with a pattern that is to be printed on a substrate. Preferably, the pattern has micro-scale or nano-scale features. As used herein, the term 'micro-scale or nano-scale' in relation to patterns or features refers to patterns or features having dimensions less than 100 μm, and preferably less than 10 μm. Such patterns are typically defined by a plurality of protrusions and channels between the protrusions. As used herein, the term 'protrusions' denotes structures or features that are raised relative to a base of the pattern. Although each of the protrusions 100a illustrated in FIG. 1 has the same height, and the base 100b of the pattern is the same for each protrusion 100a, skilled persons will appreciate that this arrangement is not essential.

Figure 1:
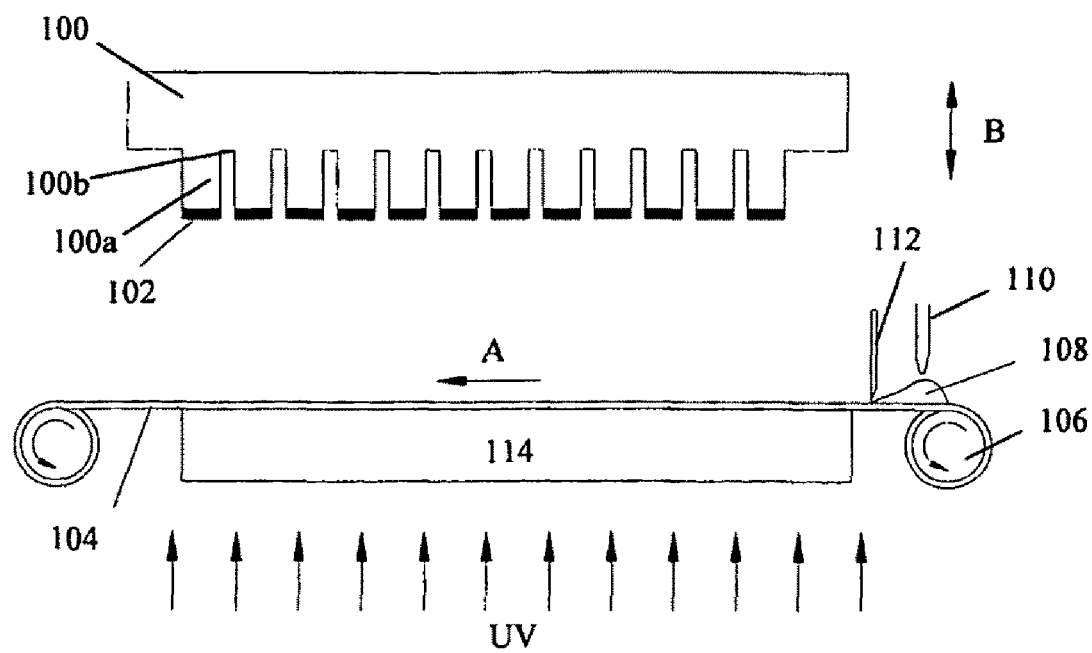
FIG. 1 is a cross-section diagram of one example embodiment of UV transfer embossing printing.

FIG. 1 also shows the mold 100 provided with a coating of ink material 102 such that the protrusions 100a of the mold 100 carry the ink material 102. In one form, the patterned surface of the mold 100 is controllably contacted with a reservoir of ink material so as to coat the protrusions 100a of the pattern with the ink material 102. The ink material 102 may be, for example, real ink or any other material, such as a metallic film, a conducting polymer material, semiconducting polymer material, conducting nanoparticles and semiconducting nanoparticles, which are desired to be patterned onto the substrate. Specific, but non-limiting examples, of the ink material 102 include metal nanoparticle inks such as gold, silver, copper and/or conductive metal oxide inks or polymers (which may be used to form the OFET electrodes) and semiconducting polymer inks (which may be used to form the OFET active layer). The term 'ink material' herein includes such material and other variants that will be apparent to skilled persons.

The substrate 104 in the embodiment of FIG. 1 is a flexible transparent substrate film 104. Skilled persons will appreciate that a non-transparent and non-flexible substrate may be used instead, where necessary or desired. In the illustrated embodiment, the flexible substrate 104 is unwound from a reel 106 and is coated with a UV-curable liquid resin 108. The resin 108 may be a combination of multifunctional acrylate or methacrylate, epoxide and their oligomers, polymers and the like. Preferably, no releasing agent is provided in the resin 108 as good adhesion is required between the resin 108 (once cured) and the ink material 102, as will be explained below.

In one non-limiting arrangement, the resin 108 is first dispensed through a dispenser 110 near the reel 106, and is smoothed to form a coating using a doctor blade 112 as the film 104 is unwound from the reel 106 and travels in the direction A, as shown in the figure. In one specific form, the resin 108 is coated on the film 104 to a thickness of between 1-100 microns. It will be appreciated that the thickness of the resin 108 should be less than the height of the protrusions 100a that form part of the pattern on the embossing mold 100 to ensure accurate embossing of the pattern onto the substrate 104.

To transfer the ink material 102 onto the substrate 104, the embossing mold 100 is moved in the direction B shown in the figure, and is brought into intimate contact with the coated film 104. UV light is then irradiated on the resin 108 so as to cure and harden the resin 108. In the form illustrated, UV light is irradiated from underneath the film 104 and passes through a transparent (to light, or more specifically to UV light) support 114, which supports the film 104 as the embossing mold 100 is brought into intimate contact with the film 104. In an alternative arrangement, the UV light may be irradiated directly on the coating of resin 108 from above the coated film 104. Once the resin 108 is cured, the embossing mold 100 is lifted from the film 104, leaving the ink material 102 printed on the film 104.

Figure 2:
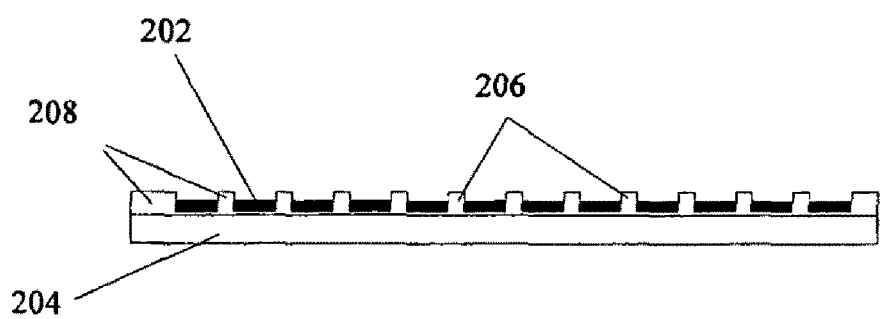
FIG. 2 is a cross-section diagram of an embossing-printed pattern obtained using the UV transfer embossing printing of FIG. 1.

FIG. 2 illustrates the resulting structure that is formed on the substrate following the steps described above. Specifically, the substrate 204 after UV transfer embossing printing includes patterns of ink material 202 that have been embossed onto the substrate 204 and that are interspersed with UV resin 208. As will be explained below, the use of UV transfer embossing printing to form the patterns allows micro-scale or nano-scale features to be formed on the substrate 204. In the form illustrated, the micro-scale or nano-scale features are the micro-scale or nano-scale walls 206 that separate portions of the ink material 202. The use of this embossed-printed structure in the formation of OFETs and OFET-based devices will be described later in this specification.

Figure 3A:
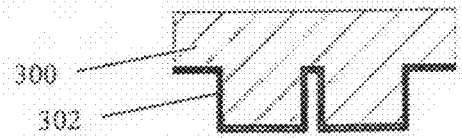
FIGS. 3A-3C are cross-section diagrams of another example embodiment of UV transfer embossing printing.
Figure 3B:
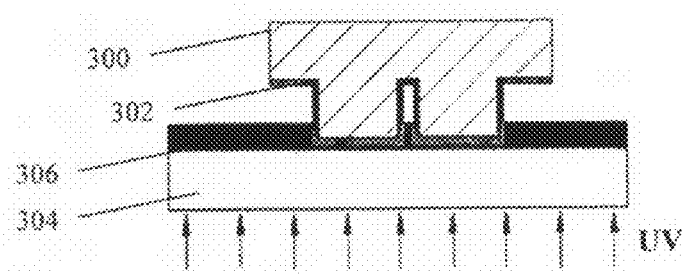
Figure 3C:
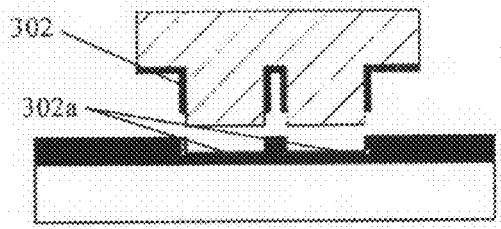

Another exemplary embodiment of the method of fabricating OFETs is shown in FIGS. 3A-3C. In this embodiment, the embossing mold 300 is provided with ink material 302 that continuously covers the patterned surface (i.e. the protrusions and base of the pattern) of the mold. As noted earlier, the ink material 302 may be real ink or any other material, such as a metallic film, a conducting polymer material, semiconducting polymer material, conducting nano particles or semiconducting nano particles, which are desired to be patterned onto the substrate. As illustrated in FIG. 3B, the embossing mold 300, which includes the ink material 302 that continuously covers the patterned surface, is brought into contact with a polymer substrate 304 having a coating of UV-curable resin 306 such that the ink material 302 partially contacts the resin 306 at protrusions on the mold 300. The ink material 302 is then selectively printed onto the polymer film 304 by virtue of adhesive properties of the resin 306 during curing and hardening under UV irradiation. Specifically, the curing and hardening of the resin 306 provide good selective detachment of the portions 302a of the ink material 302 from the mold (i.e. only from the patterned protrusions of the mold 300), as shown in FIG. 3C.

In the embodiments described above, the method may begin with a patterned embossing mold (i.e. with a mold that already has patterns) or with the preparation of an embossing mold (i.e. with a mold that has not been patterned). If the method begins with the latter, the method may include the step of patterning micro-scale or nano-scale patterns on a surface of the mold. In one specific form, this may be done using a photoresist process followed by either etching or electroforming. In another specific form, the patterning may be done using a photoresist process followed by silicon etching and then silicon oxidation. The surface of the mold may then be coated with a monolayer of silane coupling agent followed by a layer of siloxane releasing agent for easy demolding. The coupling agent and releasing agent are preferably selected so that there is a covalent bond between the coating layer (i.e. the coupling agent and releasing agent) and the mold surface to ensure durability of the coating layer.

Figure 4A:
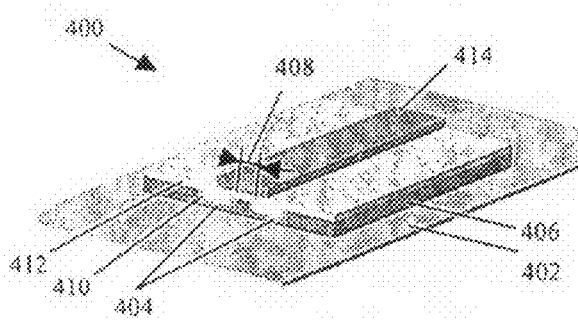
FIGS. 4A and 4B are a perspective diagram and a cross-section diagram respectively of an exemplary embodiment of an embossing-printed OFET.
Figure 4B:
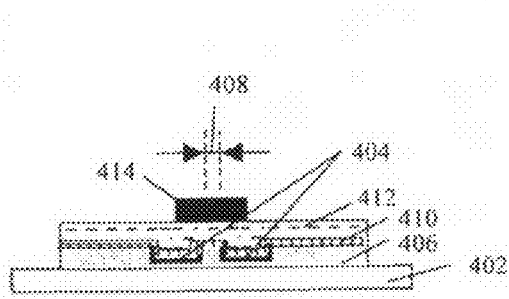

Referring to FIGS. 4A and 4B, an exemplary embodiment of an OFET fabricated using UV transfer embossing printing is shown generally with arrow 400.

The OFET 400 is shown formed on a flexible substrate 402. The OFET 400 includes source and drain electrodes 404, which may comprise conducting materials (e.g. metallic films, conducting nano-particles, etc) that form part of a pattern that has been embossed onto a coating of UV-cured resin 406 on the substrate 402. The embossing of the electrodes 404 may be carried out using any one of the UV transfer embossing printing methods described earlier. Given the ability of UV transfer embossing printing to provide micro-scale or nano-scale features, the electrodes may be formed such that a micro-scale or nano-scale channel length 408 is provided.

The OFET 400 further includes an active layer 410. The active layer 410 (i.e. an organic/polymer semiconductor material layer) can be printed by transfer embossing printing with or without UV irradiation, depending on requirements of the active material ink. The active layer 410 may also be solution-processable. In this form, the active layer 410 may be applied onto the embossed electrodes 404 by any appropriate method, such as spin coating, dip coating and solution casting.

Over the active layer 410, a layer of dielectric material 412 is provided to isolate the active layer from gate material 414, which forms the gate electrode of the OFET. Like the active layer 410, the dielectric material 412 may be transfer-embossed-printed or solution-processed. The dielectric material 412 may also be deposited by chemical vapour deposition (e.g. plasma-enhanced chemical vapour deposition (PECVD)). The gate material 414 may be provided by transfer embossing printing, casting, evaporation or sputtering, for example.

The OFET 400 described above and as illustrated in FIGS. 4A and 4B has a top-gate configuration (i.e. gate electrode 414 is provided on top of the OFET 400, and source and drain electrodes 404 are provided at the bottom of the OFET 400). Skilled persons will appreciate that the OFET 400 may alternatively be formed with a bottom-gate configuration. Where a bottom-gate configuration is desired, the gate electrode 414 is first provided on the substrate 402. The dielectric material 412 is then provided over the gate electrode 414, the active layer 410 is provided over the dielectric material 412, and the source and drain electrodes 404 are provided over the active layer 410. As with the top-gate configuration, one or more OFET structures of the bottom-gate configuration may be formed by UV transfer embossing printing.

An example method of fabricating the OFET shown in FIGS. 4A and 4B will now be described with reference to FIGS. 5A-5F. Skilled persons will appreciate that the steps and sequence illustrated are not limiting and only serve to provide an example of how the OFET may be fabricated.

Figure 5A:
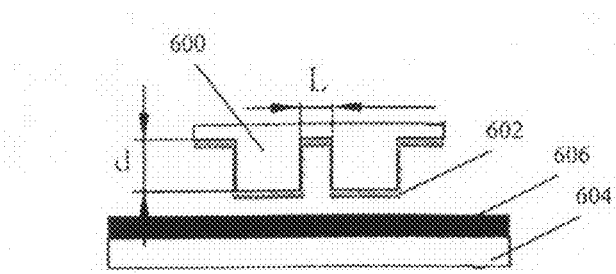
FIGS. 5A-5F are cross-section diagrams of UV transfer embossing printing of OFET electrodes and subsequent fabrication of an OFET.

FIG. 5A shows the preparation of the embossing mold 600, which is provided with a pattern having arrays of protrusions and channels separating the protrusions. In the example illustrated, the embossing mold 600 is fabricated via photolithography and deep reactive ion etching. The etching was carried out such that the depth of the pattern (d, as indicated in FIG. 5A) is 50 μm and arrays of protrusions are separated by channels 4.0±0.1 μm wide (L, as indicated in FIG. 5A). The surface of the mold 600 is then prepared by oxygen plasma treatment before being coated with a siloxane releasing agent. The mold 600 was then provided with a 100 nm-thick gold film 602 as ink material, which may be provided via sputtering or e-beam evaporation.

FIG. 5A also shows the flexible substrate 604 having thereon a coating of UV-curable resin 606. The substrate 604 in this example is a transparent polyethylene terephthalate (PET) film (specifically Melinex® 454 film from DuPont Company) and the resin used was a mixture of monomers EB600, SR508, SR351 with weight percentages of 60%, 25%, 15% respectively. EB600 is a bisphenol A epoxy diacrylate oligomer supplied by UCB chemicals. SR508 and SR351 are dipropylene glycol diacrylate and trimethylopropane triacrylate supplied by Sartomer. 2,2-dimethoxy-2-phenylacetophenone (or Irgacure 651 by CIBA Speciality Chemicals, Basel, Switzerland) was used as the UV photoinitiator in a 0.3% proportion by weight. In the form illustrated, the resin 606 is coated to 1 μm-thick by spin coating at 5000 rpm.

Figure 5D:
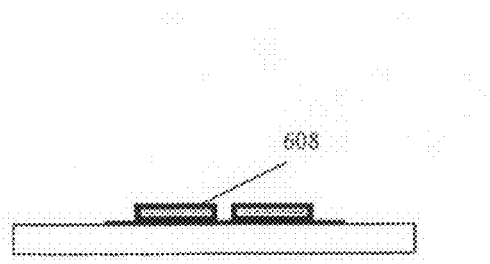
Figure 5B:
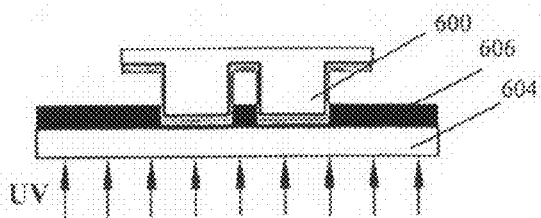

FIG. 5B shows the bringing together of the pre-coated mold 600 and the PET film 604, such that the protrusions of the mold 600 are in contact with the resin 606. This process is performed at ambient atmosphere in the illustrated embodiment. UV light is then irradiated through the transparent support via the bottom of the film. The resin 606 at areas that contact the mold is cured (i.e. cross-linked) and hardened as a result of the exposure to UV light. However, the resin at areas that are not in contact with the mold 600 is not cured. This is due to the presence of oxygen in the air to which those areas are exposed. Specifically, the curing of the resin is a radical-induced polymerisation of acrylate resin. This polymerisation is inhibited by molecular oxygen, which reacts rapidly with alkyl radicals, especially when the polymerisation is carried out in thin films.

Figure 5E:
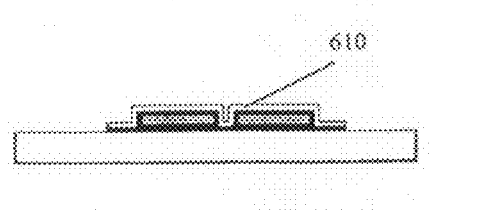
Figure 5C:
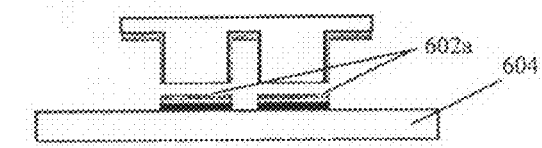

FIG. 5C shows the resulting structure once:
 (i) the resin in the contact areas have cured and hardened,
 (ii) the mold 600 is lifted, leaving arrays of gold thin film 602a on UV cured resin portions on the PET film 604, and
 (iii) uncured resin is rinsed using ethanol.

Figure 6A:
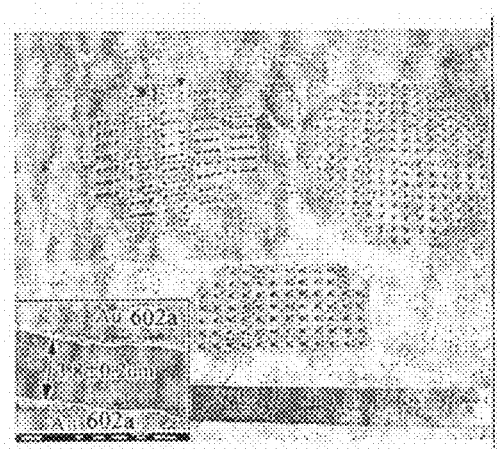
FIG. 6A is an image of embossed-printed electrode arrays on a polyethylene terephthalate (PET) film, with an inset of a scanning electron microscope (SEM) image showing a plan view of the channel between two electrodes.
Figure 6B:
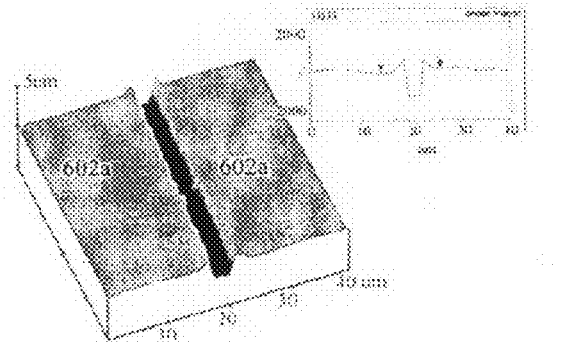
FIG. 6B is an atomic force microscope (AFM) image showing a cross-section of the embossed electrodes of FIG. 6A.

In the form shown, the gold thin film array 602a forms the source and drain electrodes of the OFET. An image of arrays of embossed electrodes that can be formed using this method is shown in FIG. 6A, which also includes an inset of a scanning electron microscope (SEM) image showing the channel between two embossed electrodes. In the specific example described above, the measured channel length between the two gold electrodes on the PET film is 3.8±0.2 μm, which corresponds closely to the structure dimensions patterned on the mold. Another view of the electrodes and the channel is provided in FIG. 6B, which is an atomic force microscope (AFM) image showing a cross-section of the embossed electrodes.

FIG. 5D shows the subsequent process of forming the OFET active layer 608 on the embossed electrodes. In this specific and non-limiting example, the active layer 608 is regioregular poly(3-hexylthiophene) (RR-P3HT), and is provided by spin-coating RR-P3HT from solution in chloroform (concentration 5 mg/mL) at a speed of 1500 rpm for 30 s and dried for 30 min at 70° C. Of course, where necessary or desired, other organic materials may be used as the active layer, non-limiting examples of which include small molecules such as rubrene, tetracene, pentacene, perylenediimides, tetracyanoquinodimethane (TCNQ), and polymers such as polyfluorene, polydiacetylene, poly 2,5-thienylene vinylene, poly p-phenylene vinylene (PPV). Skilled persons will also appreciate that the active layer 608 may be formed by UV transfer embossing printing. Other forms of embossing printing (e.g. thermal embossing printing) may also be used.

FIG. 5E shows the next step of forming a dielectric layer 610 over the active layer 608. In this specific and non-limiting example, the dielectric layer is formed from polyvinylphenol (PVP) (from Aldrich) that is spin-coated (1000 rpm, 30 s) from solution in isopropyl alcohol (IPA) (concentration 100 mg mL−1) and dried for 30 min at 70° C. The measured thickness of the PVP film 610 is 1.1±0.1 µm.

Figure 5F:
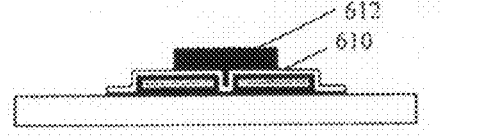

FIG. 5F shows the next step of forming a gate electrode 612 over the dielectric layer 610. In this specific and non-limiting example, silver paste was spin-coated (3000 rpm, 30 s) on top of the PVP layer 610 and baked at 70° C. for 30 min, to form the gate electrode 612. Where necessary or desired, embossing printing may be used to form the gate electrode 612.

All of the fabrication processes above were carried out in ambient atmosphere and temperature, except for the baking processes, which were carried out in a vacuum oven.

The performance of the OFETs fabricated using the method above was measured using an Agilent 5270B parameter analyser with a CASCADE probe station. The channel length (i.e. L, distance between electrodes) is 4 µm and the channel width (i.e. W, electrode length) is 3000 µm, which is representative of high aspect ratio features that are obtainable using the above method.

Figure 7A:
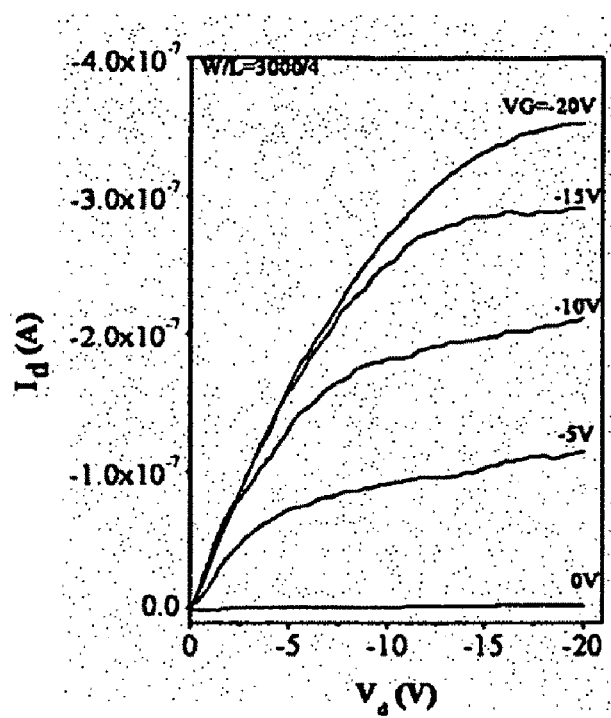
FIGS. 7A and 7B are graphs showing the current-voltage characteristics and the transfer curve respectively of an exemplary embossed OFET on a PET film.
Figure 7B:
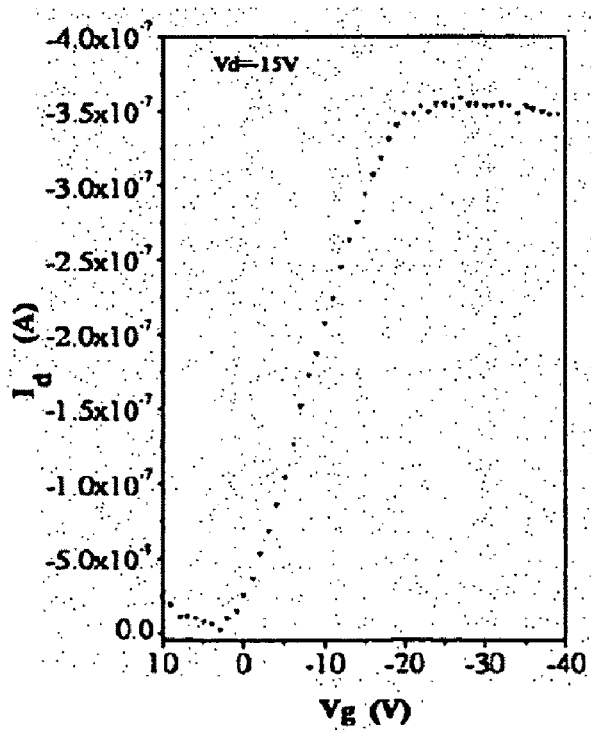

FIG. 7A shows the drain-source current versus drain-source voltage of one of the fabricated OFETs at a range of gate voltages, and FIG. 7B shows the OFET's transfer curve. It is clear that the OFET fabricated shows good saturation behaviour. The drain current (i.e. on current) is about $10^{-7}$ A at $V_d=-20V$ and $V_g=15V$. The extracted field-effect mobility of the OFET is 0.0016 cm$^2$/V·s, threshold voltage ($V_{th}$) is 3.0V and the on/off current ratio is 102.

Considering the large value of W/L, the drain current of the OFET (about $10^{-7}$ A) is low. This is attributable to two factors. One is the low capacitance resulted from the relatively high thickness (about 1.1 µm) of the PVP film. Measured capacitance per unit area of the PVP film was 3.2×10−5 F/m$^2$, corresponding to a dielectric constant of 3.7. The second factor that is believed to have resulted in low drain current is low mobility. Skilled persons will appreciate that the morphology of a gate insulator is one of the factors that determine carrier mobility, since a smooth surface leads to good molecular ordering of the semiconductor. The PET film surface used in the above example is much rougher than conventional polished silicon wafer. The roughness does, however, slightly decrease after application of P3HT to the PET film.

As noted earlier, the measured $I_{on}/I_{off}$ ratio of the fabricated devices is about 102. This is attributable to the oxygen and humidity since the coating of P3HT and PVP and device measurements were performed in ambient atmosphere. The charge trapping at the active/dielectric interface leads to a positive threshold voltage, resulting in a big leakage current. The devices exhibit an off current of around $10^{-9}$ A and have a low on/off ratio.

One application of the above fabricated OFET is in the formation of an integrated OFET-based bioarray, bio-lab-on-chip device or the like. An example embodiment of an OFET-based lab-on-chip device will now be described with reference to FIGS. 8A-8E.

FIGS. 8A and 8B show plan views of a base part 800 and a cover part 802 of the device. In one form, both parts are made of plastic. The base part 800, which may be the substrate as described earlier, is embossed-printed with an array of source electrodes 804 and drain electrodes 806. An array of references electrodes 808 is also embossed-printed on the base part 800. In terms of connectivity, the source electrodes 804 in each row are connected together, a common reference electrode 808 is located in each column of the array, and all of the drain electrodes 806 are connected together. As will be explained below, this results in a source/reference electrode addressable array biochip. In the form illustrated, four rows of source electrodes 804 are provided. Each row is selectively activated using the four switches S1, S2, S3 and S4 provided. As for reference electrodes 808, five columns are provided, each being individually selectable using switches R1, R2, R3, R4 and R5.

The base part 800 also includes a semiconducting layer or active layer (not shown) that is printed on the gap between each pair of source and drain electrodes 804, 806, and a dielectric layer 810 that is printed over each pair of source and drain electrodes 804, 806 and the semiconducting layer between the source and drain electrodes 804, 806. The relative arrangement of the drain and reference electrodes 806, 808 and the dielectric layer 810 is more clearly illustrated in FIG. 8C, which shows a cross-section of the base part 800. It should be noted that the reference electrode 808 serves as a substitute for a gate electrode, which would normally be formed on the dielectric layer 810. However, because the dielectric layer 810 should be exposed to detect analytes (as will be explained below), the gate electrode is substituted with a reference electrode 808 that is provided on the base (i.e. substrate) adjacent the source and drain electrodes 804, 806.

The cover part 802 includes micro-scale or nano-scale microfluidic channels 812, as shown in the cross-section of the cover part 802 illustrated in FIG. 8D. The channels are preferably fabricated using the embossing method described earlier.

In use, probe molecules are first immobilised onto the surface of the base part 800 such that they contact the dielectric layer 810 and reference electrode 808. To ensure no other parts of the OFET in the device are exposed to the probe molecules, all other parts of the OFET (besides the source electrode and reference electrode) are preferably coated with an insulation layer.

Once the probe molecules have been immobilised, the cover part 802 is mounted on the top of the base part 800 to form sealed microchannels 814 that are isolated from one another, as illustrated in FIG. 8E. A sample containing target molecules is then transported into different column channels so as to react with different probes at different sites on the device. After reaction and washing with buffer solutions, array detection can be conducted by simply multiplexing switches to different addresses, such as S1R1, S2R2 . . . , for detecting target molecules at different sites on the device. Different analytes or different concentration of the same analyte in the electrolyte affect the dielectric layer of the OFET, resulting in changes of electron density in the inversion layer built by imposing voltage between the reference electrode and source electrode. This change is then detectable when the OFET is switched on. Typically, the change very sensitively corresponds to the analyte concentration.

For sensor addressable array applications using liquid sample solutions, it is generally a requirement to take in account ionic shortage between different detection sites. This is typically done by provided multi-microchannels. Conventionally, however, the provision of multiple microchannels results in higher fabrication cost and generally does not allow for the fabrication of nano-array chips (which require nano scale channels). These concerns are addressed or at least alleviated given the fabrication of micro-scale or nano-scale OFETs and microchannels in accordance with the method described above. Furthermore, the connectivity of the electrodes described above reduces the number of input/output lines that are required for addressable detection, for much simpler multicomplexing, and further reducing the cost of the detection system.

The exemplary embodiments described above relate to the manufacturing process and novel architecture design for making organic transistors (OFET) and OFET-based integrated devices. Specifically, they relate to the fabrication of micro-array patterns and integrated electronics by a UV transfer embossing printing process. The fabrication and the resulting devices may have one or more of the following characteristics: lightweight, flexible, large-area coverage, structural flexibility, low temperature processing, and low cost. The method and device may be used for applications in large display panels, electronic papers, electronic packaging, smart cards, and sensors. One specific application of the device is in a bioarray sensor, which may be used as a next-generation pervasive sensor for clinical diagnosis, drug discovery, homeland security, food control and environmental protection.

The foregoing describes exemplary embodiments, which, as will be understood by those skilled in the art, may be subject to many variations or modifications in design, construction or operation without departing from the scope of the present invention as claimed. For example, while the method embodiment has been described with reference to steps to be carried out in a certain order, the method may be modified such that the steps are carried out in a different order, where appropriate. Also, the method may be modified such that additional steps carried out. Such variations, for instance, are intended to be covered by the scope of the present invention as claimed.

The invention claimed is:

1. A method of fabricating an organic field effect transistor (OFET), the method comprising:
   providing ink material on at least part of a patterned surface of a mold;
   contacting the mold on a coating of ultraviolet (UV) curable resin on a substrate so as to insert at least part of the ink material into the resin;
   irradiating the resin with UV light; and
   separating the mold from the resin so as to transfer the ink material from at least part of the patterned surface of the mold onto the resin to form at least one OFET structure.

2. The method of claim 1, wherein providing ink material comprises providing ink material on a plurality of protrusions that form part of the patterned surface.

3. The method of claim 1, wherein providing ink material comprises providing a continuous film on the patterned surface.

4. The method of claim 1, wherein the patterned surface includes at least one feature of a size selected from the group consisting of: micro-scale and nano-scale.

5. The method of claim 4, wherein the at least one feature is a channel that separates protrusions of the patterned surface, the protrusions being used to transfer ink material from the mold to the resin to form at least one pair of source and drain electrodes of the OFET.

6. The method of claim 1, wherein the patterned surface comprises a plurality of protrusions that define a pattern of an array of OFET electrodes at a scale selected from the group consisting of: micro-scale and nano-scale.

7. The method of claim 1, wherein the ink material is selected from the group consisting of: a metallic film, a conducting polymer material, a semiconducting polymer material, conducting nanoparticles and semiconducting nanoparticles.

8. The method of claim 1, wherein irradiating the resin comprises irradiating the resin from underneath the substrate and through a transparent support on which the substrate is provided, the substrate being a transparent flexible substrate.

9. The method of claim 8 further comprising:
   unwinding the flexible transparent substrate from a reel;
   dispensing the UV curable resin onto the substrate near the reel; and
   smoothing the resin to form a coating as the substrate is unwound from the reel.

10. The method of claim 1, wherein the resin is a combination of multifunctional acrylate or methacrylate, epoxide and their oligomers.

11. The method of claim 10, wherein the resin is a mixture of monomers comprising bisphenol A epoxy diacrylate oligomer, dipropylene glycol diacrylate, trimethylopropane triacrylate and 2,2-dimethoxy-2-phenylacetophenone as a UV photoinitiator.

12. The method of claim 1, wherein the resin contains substantially no releasing agent.

13. The method of claim 1, wherein the coating of the resin has a thickness in the range of 1 to 100 microns.

14. The method of claim 1, wherein the method is carried out in ambient atmosphere and ambient temperature.

15. The method of claim 5 further comprising:
   removing portions of uncured resin;
   providing active material between the at least one pair of source and drain electrodes;
   providing dielectric material over at least part of the active material; and
   providing a gate electrode over the dielectric material.

16. The method of claim 15, wherein providing active material is carried out by a process selected from the group consisting of: embossing printing, spin coating, dip coating and solution casting.

17. The method of claim 15, wherein providing dielectric material is carried out by a process selected from the group consisting of: embossing printing, spin coating, solution processing and chemical vapour deposition.

18. The method of claim 15, wherein providing a gate electrode is carried out by a process selected from the group consisting of: embossing printing, casting, evaporation and sputtering.

* * * * *